United States Patent
Togashi

(10) Patent No.: US 7,109,426 B2
(45) Date of Patent: Sep. 19, 2006

(54) PRINTED BOARD AND ELECTRONIC APPARATUS

(75) Inventor: Masato Togashi, Yamagata (JP)

(73) Assignee: Tohoku Pioneer Corporation, Yamagata (JP)

(*) Notice: Subject to any disclaimer, the term of this patent is extended or adjusted under 35 U.S.C. 154(b) by 19 days.

(21) Appl. No.: 10/878,058

(22) Filed: Jun. 29, 2004

(65) Prior Publication Data

US 2004/0262034 A1 Dec. 30, 2004

(30) Foreign Application Priority Data

Jun. 30, 2003 (JP) .......................... P2003-187767

(51) Int. Cl.
 *H01R 13/46* (2006.01)
 *H05K 5/00* (2006.01)
(52) U.S. Cl. .................. 174/520; 174/266; 174/258
(58) Field of Classification Search ............... 174/258, 174/262, 266, 520
 See application file for complete search history.

(56) References Cited

U.S. PATENT DOCUMENTS

| 4,220,810 A | * | 9/1980 | Arai et al. ............... 174/263 |
| 5,430,612 A | * | 7/1995 | Simon et al. ............ 361/752 |
| 2001/0013425 A1 | * | 8/2001 | Rokugawa et al. ...... 174/262 |
| 2001/0025724 A1 | * | 10/2001 | Aizawa et al. ........... 174/266 |

FOREIGN PATENT DOCUMENTS

| JP | 6-302987 A | 10/1994 |
| JP | 8-125288 A | 5/1996 |

* cited by examiner

*Primary Examiner*—Hung V. Ngo
(74) *Attorney, Agent, or Firm*—Sughrue Mion, PLLC

(57) ABSTRACT

A printed board includes an electrically insulating board, a conductor layer made of an electrically conducting pattern, and at least one of a resist layer and an ink layer, each made of an electrically insulating solid pattern. The electrically insulating board has one surface on which electronic parts will be mounted, and the other surface on which the conductor layer is formed and covered with at least one of the resist layer and the ink layer. An organic EL display device includes the printed board, and a housing having a planar structure. The surface on which the conductor layer of the printed board is covered with at least one of the resist layer and the ink layer, each made of the electronically insulating solid pattern is arranged so as to face a planar portion of the housing having the planar structure.

14 Claims, 3 Drawing Sheets

PRINTED BOARD AND ELECTRONIC APPARATUS

BACKGROUND OF THE INVENTION

1. Filed of the Invention

The present invention relates to a printed board and an electronic apparatus.

2. Description of the Related Art

Generally, electronic parts or the like constituting an electronic apparatus are mounted on a printed board. The printed board has an electrically insulating board which is made of a glass epoxy material or the like and which has one surface on which electronic parts will be mounted, and the other surface on which a conductor layer made of a conductor pattern of a circuit is formed by means of etching a sheet of copper foil or the like. The printed board further has through-holes which are formed in the electrically insulating board so that an inner wall of each through-hole is covered with a conductor by which conductors provided on the front and rear surfaces of the electrically insulating board are connected to each other so that the electronic parts can be electrically connected to the conductor layer.

Lands for electrical connection are provided on circumferences of the through-holes respectively. A resist layer of a solder resist film or the like is provided so that the conductor layer on the front surface is covered with the resist layer except that the lands on the circumferences of the through-holes are exposed. Paste-like ink or the like is applied onto a front surface of the resist layer by silk-screen printing so that symbols or marks are printed on the front surface of the resist layer.

For example, as disclosed in JP-A-8-125288 (Page 1 and FIG. 1) which is a conventional technique, protection marks are silk-screen printed on a front surface of a solder resist film for covering an extended portion of a conductor pattern extending to the neighborhood of a circumferential portion of an electrically insulating board so that the protection marks are arranged along the circumferential portion. The protection marks abut against a support portion of a manufacturing apparatus for mounting electronic parts or the like, so that the solder resist film and the conductor pattern are prevented from being damaged.

For example, as disclosed in JP-A-6-302987 (Page 1 and FIG. 1) which is a conventional technique, an electrically conductive shield plate is bonded to a front surface of a printed board to be mounted in an acoustic apparatus, a communication apparatus or the like in order to prevent interference with unnecessary external radio wave (noise). When the shield plate is to be bonded, each through-hole portion is covered with a nonconductive symbolic layer formed by silk-screen printing so that an electrically conductive layer on an inner wall of each through-hole is prevented from coming into contact with the shield plate because of the shield plate's bending at the through-hole portion.

As described above, the through-holes and the lands are exposed on the front surface of the background-art printed board because the resist layer is formed so as to avoid the lands on the circumferences of the through-holes. For this reason, it cannot be said that the background-art printed board has satisfactory resistance to a high-temperature high-humidity environment because water may go into the printed board through the exposed through-holes and lands. There is hence a possibility that the front surface of the printed board may be corroded due to oxidization, or the insulation resistance of the printed board may be lowered due to a migration phenomenon. Therefore, a printed board more greatly improved in resistance to the high-temperature high-humidity environment has been demanded for use in an on-vehicle electronic apparatus or the like.

To satisfy the demand, it may be conceived that a protective coating agent is applied to the front surface of the printed board to eliminate the exposed portions to thereby improve resistance to the high-temperature high-humidity environment. Extra cost and time are however spent inevitably because the protective coating agent and the coating process for the protective coating agent are required.

Incidentally, in the conventional technique described in JP-A-6-302987, the shield plate and the process for bonding the shield plate are required. Accordingly, extra cost and time are spent even on an electronic apparatus that can be provided without special attention paid to interference with unnecessary radio wave (noise).

SUMMARY OF THE INVENTION

It is an object of the invention to provide a printed board improved in resistance to a high-temperature high-humidity environment and an electronic apparatus using the printed board without necessity of extra cost and time.

According to first aspect of the invention, there is provided a printed board including: an electrically insulating board including; a conductor layer made of an electrically conducting pattern and mounted on one surface of the electrically insulating board; and an electronic part mounted on the other surface of the electrically insulating board, wherein the conductor layer is covered with at least one of a resist layer and an ink layer, which are made of an electrically insulating solid pattern.

According to second aspect of the invention, there is provided an electronic apparatus including: a housing having a planar structure including a planar portion, and the printed board according to first aspect of the invention, wherein the other surface of the electrically insulating board is arranged so as to face the planar portion of the housing.

BRIEF DESCRIPTION OF THE DRAWINGS

These and other objects and advantages of this invention will become more fully apparent from the following detailed description taken with the accompanying drawings in which.

DESCRIPTION OF THE PREFERRED EMBODIMENTS

Figure 1:
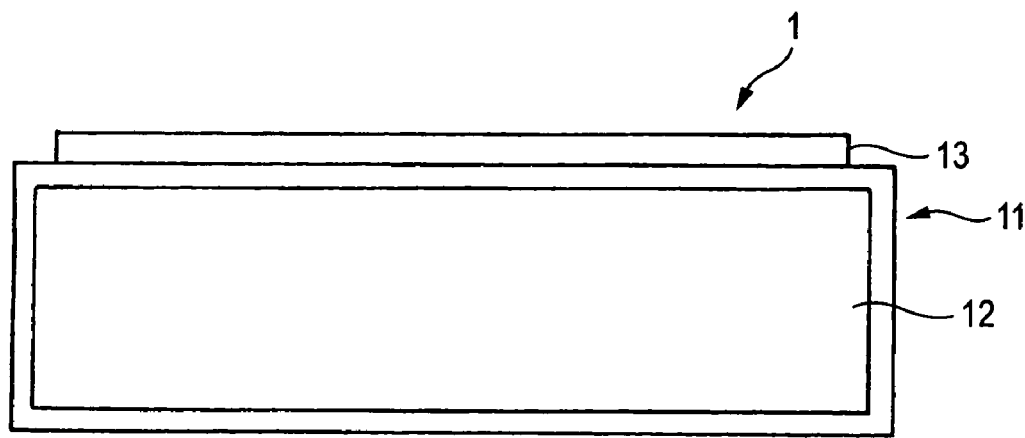
FIG. 1A is a plan view showing an electronic apparatus according to an embodiment of the invention.
FIG. 1B is a plan view showing the electronic apparatus according to the embodiment of the invention.
Figure 1:
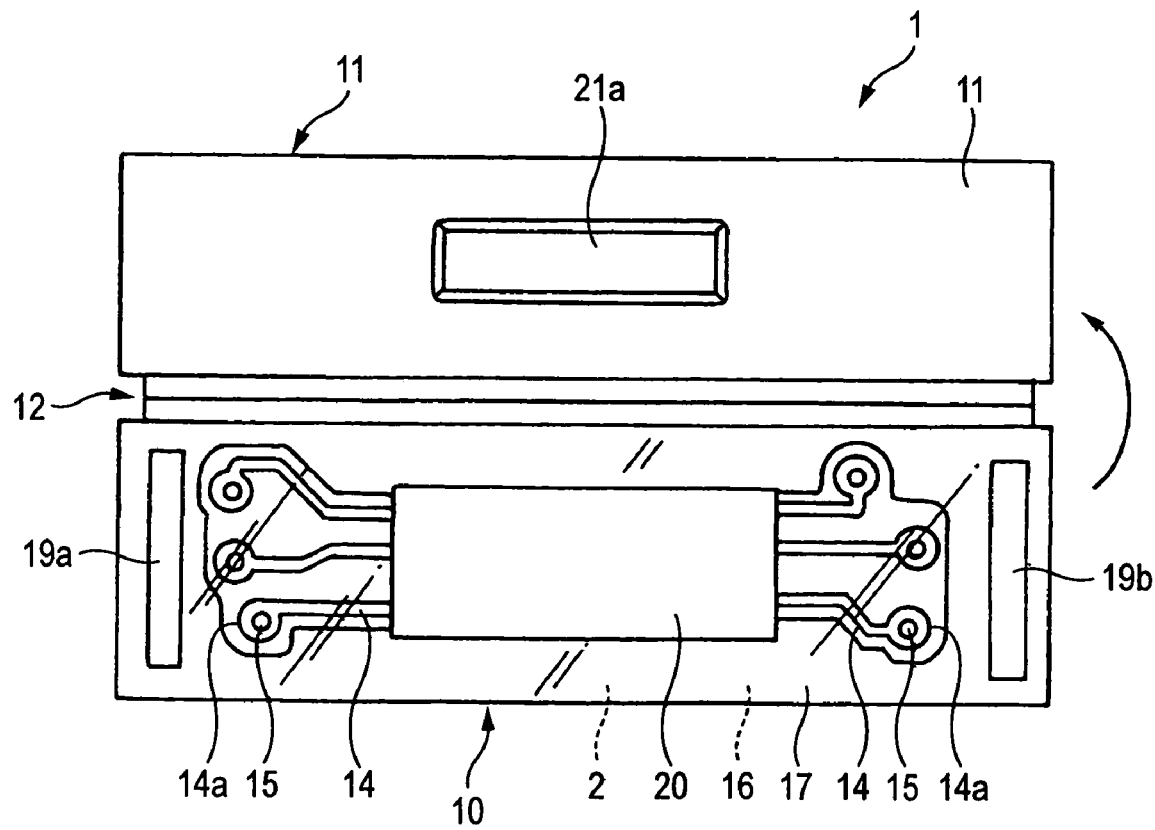
Figure 2:
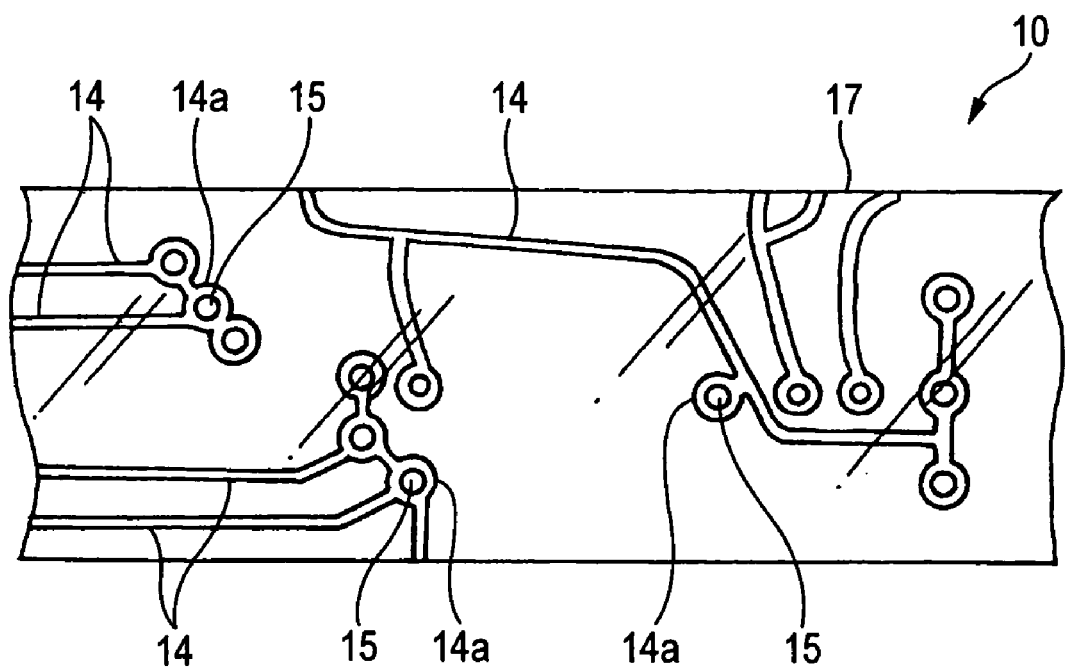
FIG. 2 is an enlarged plan view of a printed board used in the electronic apparatus according to the embodiment of the invention.
Figure 3:
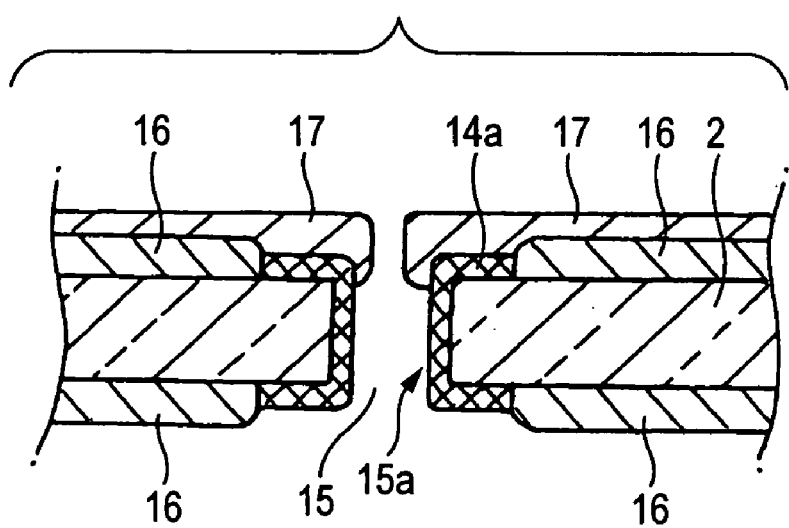
FIG. 3 is a sectional view of a through-hole formed in the printed board according the embodiment of the invention and a circumference of the through-hole.

A printed board according to an embodiment of the invention will be described below in detail with reference to FIGS. 1A and 1B and FIGS. 2 and 3. FIGS. 1A and 1B are plan views showing an electronic apparatus according to the embodiment. FIG. 2 is an enlarged plan view of a printed board used in the electronic apparatus according to the embodiment. FIG. 3 is a sectional view of a through-hole formed in the printed board and a circumference of the through-hole.

The electronic apparatus shown in FIG. 1A is, for example, an organic electroluminescent display device (hereinafter referred to as organic EL display device) 1 which has a housing 11, and a display panel 12 formed on a front surface of the housing 11.

FIG. 1B shows a state in which the housing 11 of the organic EL display device 1 is opened (in the direction of an arrow). As shown in FIG. 1B, a printed board 10 on which electronic parts constituting a drive circuit, a control circuit, etc. are mounted is provided in the inside of the organic EL display device 1. On the other hand, a rear surface (on the side opposite to the display panel) of the thus opened housing 11 has a planar structure composed of a planar portion 21 having a protrusion 21a provided in its nearly central portion. Further, the printed board 10 and the housing 11 are electrically connected to each other by a connection portion 13 (such as a flexible printed circuit board) provided with electrical wiring.

The printed board 10 has an electrically insulating board 2. Electronic parts are mounted on one (rear surface in FIG. 1B) of opposite surfaces of the electrically insulating board 2. A conductor layer 14 which is an electrically conducting pattern of a circuit is formed on the other surface (front surface in FIG. 1B) of the electrically insulating board 2. For example, the conductor layer 14 is formed as follows. A sheet of copper foil or the like is bonded to the front surface of the electrically insulating board 2 made of a glass epoxy material or the like to thereby form a copper-clad laminated plate. After processes such as copper surface cleaning, surface polishing, etc., a photo resist is applied as a predetermined pattern onto the copper foil surface and subjected to a printing and developing process. Then, the copper-clad laminated plate is etched to thereby dissolve and remove an unnecessary portion of the sheet of copper foil. In this manner, a conductor layer 14 of an electrically conducting pattern is formed, for example, as shown in FIG. 2 which is an enlarged plain view of the printed board.

Through-holes 15 are formed in the printed board 10 by means of drilling or the like so that conductor layers on the opposite surfaces are connected to each other. Lands 14a of the conductor layer are formed on circumferences of the through-holes 15 respectively in order to ensure conducting characteristic of the through-holes 15.

As shown in FIG. 3, each through-hole 15 is formed in such a manner that an inner wall 15a of the through-hole 15 is catalyzed by Pb or the like and made electrically conductive by electroless copper plating in order to electrically connect conductors on the opposite surfaces. In this manner, each through-hole 15 is formed so as to be electrically connected to corresponding lands 14a on the opposite surfaces of the printed board 10.

Resist layers 16 made of an electrically insulating coating material are formed on the opposite surfaces of the electrically insulating board and the conductor layers 14 except the lands 14a so that the opposite surfaces of the electrically insulating board and the conductor layers 14 are covered with the resist layers 16. Further, a solid pattern of an electrically insulating ink layer 17 (as represented by a hatched portion in FIG. 1B) is formed on a front surface of one of the resist layers 16 by silk-screen printing.

In this manner, the printed board 10 according to the embodiment has one surface on which electronic parts are mounted, and the other surface on which on electronic parts are mounted and the electrically insulating ink layer 17 formed by silk-screen printing is provided as a solid pattern. The solid pattern is formed in such a manner that the solid printing is applied on the front surface of the printed board 10 by a silk-screen printing method. The sold pattern is formed so that at least the lands 14a are entirely covered with the solid pattern. Accordingly, the lands 14a not covered with the resist layer 16 are covered with the solid pattern, so that the conductor layer 14 can be provided so as not to be completely exposed (see FIG. 3).

Accordingly, the printed board 10 according to the embodiment is formed so that the conductor layer 14 on the surface on which no electronic parts are mounted is covered with the electrically insulating ink layer 17 made of a perfectly (or almost) waterproof material. Accordingly, the printed board 10 can be more greatly improved in resistance to a high-temperature high-humidity environment.

Generally, the ink layer 17 can be formed with paste-like ink or the like (electrically insulating material) used for forming symbols or marks. That is, the ink layer 17 can be formed of the same material as a material used for forming symbols or marks on the surface on which electronic parts will be mounted, and the ink layer 17 can be formed by the same process as a process of forming symbols or marks on the surface on which electronic parts will be mounted. Accordingly, the ink layer 17 can be provided with out addition of any new process to the process for manufacturing a background-art printed board, so that the cost of the printed board 10 can be prevented from increasing.

The ink layer 17 is formed on the front surface of the printed board 10 by a silk-screen printing process used for printing symbols or marks, without necessity of filling the through-holes 15 with ink. In addition, the ink layer 17 need not block openings of the through-holes 15 completely if the ink layer 17 can be formed so that the lands 14a are covered with the ink layer 17 as shown in FIG. 3.

In this manner, penetration of water into the printed board 10 can be retarded sufficiently even in the case where the through-holes 15 are not completely blocked by the ink layer 17 and, in addition, even in the case where the conductors present on the surface on which electronic parts are mounted are exposed as they are. This fact is apparent from a result of comparison in high-temperature high-humidity test between Example and Comparative Example which will be described later.

Incidentally, when the diameter of each of the through-holes 15 is small or when the quantity of ink applied is relatively large, some of the openings of the through-holes 15 may be completely blocked.

Further, when the ink layer 17 keeps the conductor layer 14 in a non-exposed state as described above, an antistatic effect can be obtained. In this manner, the conductor layer 14 can be prevented from being damaged, for example, in a process of mounting the printed board 10 on the organic EL display device 1 or the like.

When the housing 11 of the organic EL display device 1 shown in FIG. 1B is closed, the protrusion 21a of the housing 11 comes into contact with an electrically insulating sheet 20 of the printed board 10 so that the printed board 10 and the housing 11 are integrated with each other. The planar portion 21 of the housing 11 is supported by cushioning portions 19a and 19b provided at opposite ends of the printed board 10. As a result, a gap is formed between the printed board 10 and the housing 11. This gap is, for example, not larger than the thickness of the printed board.

In a recent electronic apparatus (particularly, in an electronic apparatus used in information equipment), reduction in thickness of the housing has been demanded. As described above, the gap is often narrowed in accordance with this demand. The narrower the gap is, the more water is apt to be stagnated structurally. Therefore, the structure according to the embodiment in which the conductor layer 14 on the front surface of the printed board 10 is covered with the ink layer 17 is effective in enhancing the waterproof property of the thin electronic apparatus.

Particularly an on-vehicle electronic apparatus or the like is often used under a harsh condition, that is, under a high-temperature high-humidity environment. Therefore, the printed board 10 and the organic EL display device 1 according to the embodiment are suitable for the on-vehicle electronic apparatus or the like.

When the printed board 10 according to the embodiment is used, the front surface of the printed board 10 can be prevented from being damaged due to "rubbing" or the like at the time of transporting the organic EL display device 1 or on the manufacturing site of the organic EL display device 1. Moreover, the conductor layer 14 can be kept in a non-exposed state so that an antistatic effect can be obtained. In addition, the conductor layer 14 can be prevented from being damaged in the mounting process.

EXAMPLE

A result of comparison in a high-temperature high-humidity test between Example of an organic EL panel device using the printed board according to the embodiment and Comparative Example of an organic EL panel device using a printed board without a solid pattern of an ink layer will be described below.

The organic EL panel device according to Comparative Example had the same structure as that in FIGS. 1A and 1B except that the solid pattern of the ink layer was not formed on the front surface of the printed board by silk-screen printing. Two identical samples each of which was provided as the organic EL panel device according to Comparative Example were put in a test furnace in the condition that the housing of each sample was closed so that the planar portion and the printed board faced each other while the display panel of each sample faced sideways. The environment in the furnace was set at a temperature of 85 C. and humidity of 85%. Then, a current was applied to each organic EL panel device sample so as to fully turn the display panel on. The state in which each organic EL panel device sample was fully turned on was kept for 1000 hours.

The organic EL panel device according to Example has the structure shown in FIGS. 1A and 1B in which an ink layer was provided as a solid pattern on the front surface of the printed board by silk-screen printing. Three identical samples each of which was provided as the organic EL panel device according to Example were put in a test furnace in the condition that the housing of each sample was closed so that the planar portion and the printed board faced each other while the display panel of each sample faced sideways. The environment in the furnace was set at a temperature of 85 C. and humidity of 85%. Then, a current was applied to each organic EL panel device sample so as to fully turn the display panel on. The state in which each organic EL panel device sample was fully turned on was kept for 1000 hours.

Figure 4:
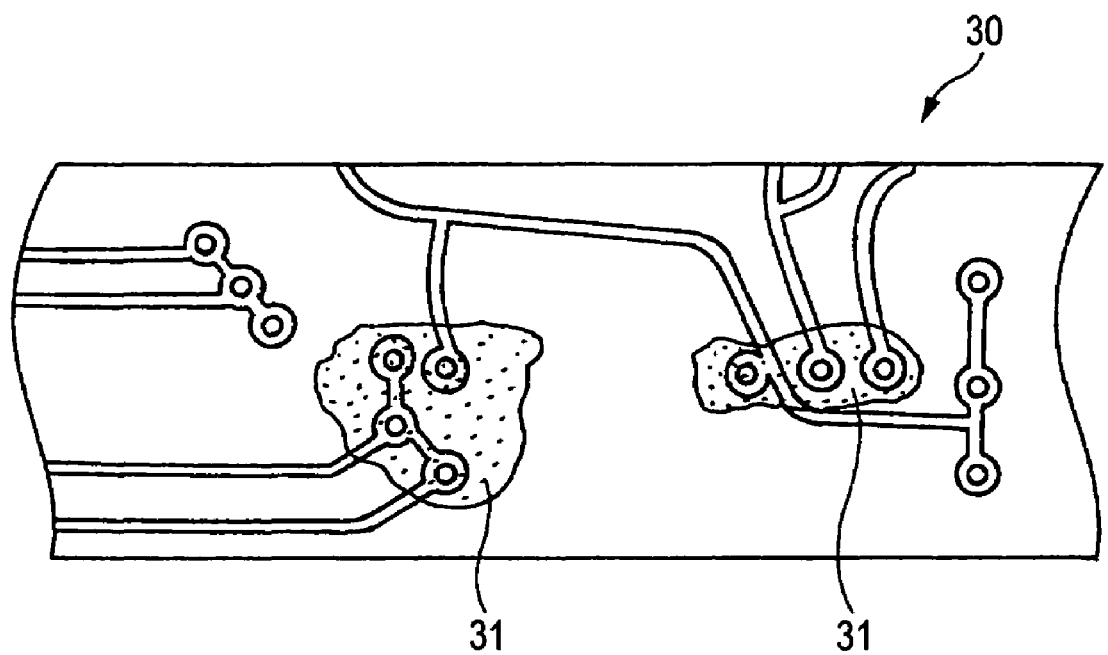
FIG. 4 is an enlarged plan view of a printed board according to Comparative Example after a high-temperature high-humidity test.

As a result of the test, at the stage in which the two organic EL panel device samples according to Comparative Example were tested for 300 hours, discolored portions 31 were produced on the front surface of each printed board 30 and on circumferences of through-holes in places where through-holes were formed densely, as shown in FIG. 4 which is a enlarged plan view of the printed board. Conceivably, this is because corrosion or a migration phenomenon due to stagnation of water in a gap between the printed board and the planar portion of the housing caused electrical short-circuiting of the circumferences of the through-holes (especially, in places where through-holes were formed densely). When an electrical characteristic test was carried out, failure in current conduction of the through-holes was found.

Figure 5:
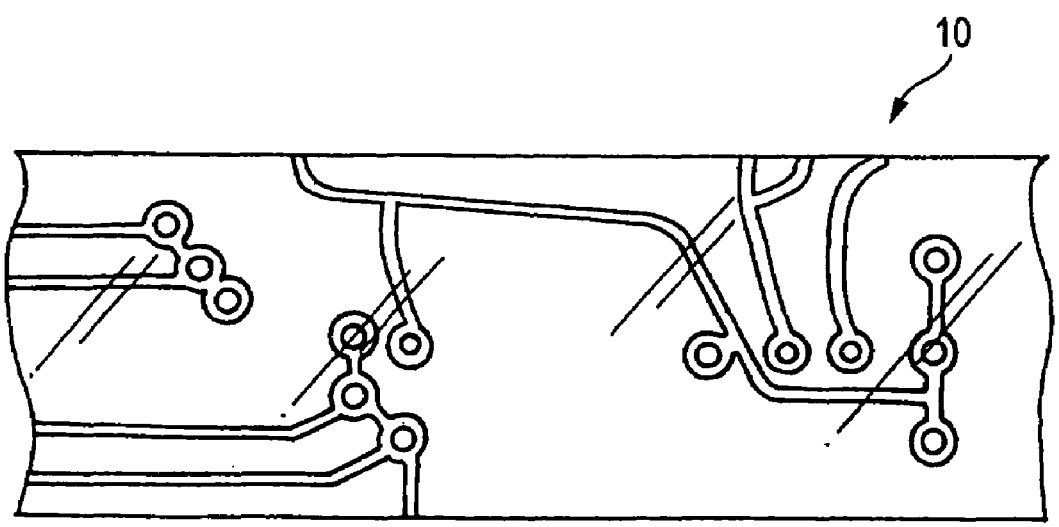
FIG. 5 is an enlarged plan view of a printed board according to Example after the high-temperature high-humidity test.

On the other hand, even after the organic EL panel device samples according to Example were tested for 1000 hours, there was no discolored portion produced on the front surface of each printed board 10 (refer to FIG. 5 which is an enlarged plan view of the printed board) though the number of the organic EL panel device samples according to Example under test was three, that is, one more than the number of the organic EL panel device samples according to comparative Example. Also in the case where the electrical characteristic test was carried out, there was no change in electrical characteristic compared with that before the test. Accordingly, good characteristic was exhibited.

Although the embodiment has been described on the case where one conductor layer is used, the invention may be also applied to the case where the printed board is a so-called multi-layer printed board having at least one conductor layer in its inside, that is, having at least two conductor layers.

The solid pattern of the ink layer may be replaced by a solid pattern of a resist layer. Or both the ink layer and the resist layer may be used as solid patterns.

The electronic apparatus need not be an organic EL display device. The electronic apparatus may be another kind of electronic apparatus such as an electronic control portion of an automobile or a car stereo as long as a printed board according to the embodiment is used in the electronic apparatus.

As described above, the printed board 10 according to the embodiment includes an electrically insulating board 2 having one surface on which electronic parts will be mounted, and the other surface on which a conductor layer 14 made of an electrically conducting pattern is formed and covered with a resist layer 16 and/or an ink layer 17 each made of an electrically insulating solid pattern. Accordingly, a printed board improved in resistance to a high-temperature high-humidity environment can be obtained without necessity of extra cost and time.

The organic EL display device 1 according to the embodiment includes the printed board 10, and a housing 11 having a planar structure, wherein the surface on which the conductor layer 14 of the printed board 10 is covered with the resist layer 16 and/or the ink layer 17 each made of the electrically insulating solid pattern is arranged so as to face a planar portion 21 of the housing 11 having the planar structure. Accordingly, an electronic apparatus improved in resistance to a high-temperature high-humidity environment can be obtained without necessity of extra cost and time.

The foregoing description of the preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A printed board comprising:
   an electrically insulating board;
   a first conductor layer made of an electrically conducting pattern and mounted on one side of the electrically insulating board;
   an electronic part mounted on the other side of the electrically insulating board,
   wherein the first conductor layer is covered with a resist layer and an ink layer, which are made of an electrically insulating solid pattern;
   a through hole that is formed through the electrically insulating board to connect the first conductor layer to a second conductor layer formed on the other side of the electrically insulating board; and
   a land portion formed on a circumference of the through hole,
   wherein the ink layer at least partially covers the land portion.

2. A printed board according to claim 1, wherein the ink layer is formed by silk-screen printing.

3. A printed board according to claim 2, wherein the ink layer is formed in a same process as a process of printing a symbol on the other surface of the electrically insulating board.

4. A printed board according to claim 3, wherein the ink layer is formed of a same material as a material with which the symbol is printed on the other surface of the electrically insulating board.

5. A printed board according to claim 1, wherein the resist layer is formed in a same process as a process of applying a resist film on the other surface of the electrically insulating board.

6. A printed board according to claim 5, wherein the resist layer is formed of a same material as a material of a resist film applied on the other surface of the electrically insulating board.

7. A printed board according to claim 1, wherein two or more conductor layers are formed inside of the printed board.

8. An electronic apparatus comprising:
   a housing having a planar structure including a planar portion, and
   the printed board according to claim 1, wherein
   the other surface of the electrically insulating board is arranged so as to face the planar portion of the housing.

9. An electronic apparatus according to claim 8, wherein a protrusion is provided as part of the planar structure of the housing, and
   the other surface of the electrically insulating board is covered with at least one of the resist layer and the ink layer which is contact-bonded to the protrusion of the housing through an electrically insulating sheet.

10. An electronic apparatus according to claim 9, wherein a gap formed in any other place than the contact-bonded place is not larger than a thickness of the printed board.

11. An electronic apparatus according to claim 8, wherein the electronic apparatus is an organic electroluminescent display device.

12. An electronic apparatus according to claim 8, wherein the electronic apparatus is an on-vehicle apparatus.

13. An electronic apparatus comprising:
   a housing having a planar structure including a planar portion, and
   the printed board comprising:
      an electrically insulating board including;
         a conductor layer made of an electrically conducting pattern and mounted on one side surface of the electrically insulating board; and
         an electronic part mounted on the other surface of the electrically insulating board,
   wherein the conductor layer is covered with at least one of a resist layer and an ink layer, which are made of an electrically insulating solid pattern,
   wherein the other surface of the electrically insulating board is arranged so as to face the planar portion of the housing
   wherein a protrusion is provided as part of the planar structure of the housing, and
   wherein the other surface of the electrically insulating board is covered with at least one of the resist layer and the ink layer which is contact-bonded to the protrusion of the housing through an electrically insulating sheet.

14. An electronic apparatus according to claim 13, wherein a gap formed in any other place than the contact-bonded place is not larger than a thickness of the printed board.

* * * * *